United States Patent [19]
Dixit et al.

[11] Patent Number: 5,670,419
[45] Date of Patent: Sep. 23, 1997

[54] METHOD OF FABRICATING ANTIFUSES IN AN INTEGRATED CIRCUIT DEVICE AND RESULTING STRUCTURE

[75] Inventors: Pankaj Dixit, San Jose; William P. Ingram, III, Los Altos; Monta R. Holzworth, Santa Clara; Richard Klein, Mountain View, all of Calif.

[73] Assignee: Crosspoint Solutions, Inc., Milpitas, Calif.

[21] Appl. No.: 471,472

[22] Filed: Jun. 6, 1995

Related U.S. Application Data

[60] Continuation of Ser. No. 158,134, Nov. 24, 1993, Pat. No. 5,527,745, which is a division of Ser. No. 782,837, Oct. 24, 1991, Pat. No. 5,322,812, which is a continuation-in-part of Ser. No. 672,501, Mar. 20, 1991, abandoned.

[51] Int. Cl.$^6$ ........................................ H01L 21/44
[52] U.S. Cl. ........................ 437/189; 437/192; 437/193
[58] Field of Search .......................... 437/60, 189, 192, 437/193, 225, 228, 922; 257/530

[56] References Cited

U.S. PATENT DOCUMENTS

| | | | |
|---|---|---|---|
| 3,312,871 | 4/1967 | Seki et al. | 317/101 |
| 3,558,992 | 1/1971 | Heuner et al. | 317/101 |
| 4,569,121 | 2/1986 | Lim et al. | 437/101 |
| 4,914,055 | 4/1990 | Gordon et al. | 437/228 |
| 5,070,384 | 12/1991 | McCollum et al. | 437/193 |

FOREIGN PATENT DOCUMENTS 2556275  7/1976  Germany.

OTHER PUBLICATIONS

Sze, VLSI Technology, 1988, McGraw-Hill pp. 377, 380–382.

Primary Examiner—Kevin Picardat
Attorney, Agent, or Firm—Townsend and Townsend and Crew

[57] ABSTRACT

Various improvements in the fabrication of an antifuse having silicon-amorphous silicon-metal layer structure are presented. Included are improved deposition techniques for the amorphous silicon layer. The improvements include steps for the fabrication of such an antifuse without the use of platinum and the resulting antifuse and contact structures.

7 Claims, 7 Drawing Sheets

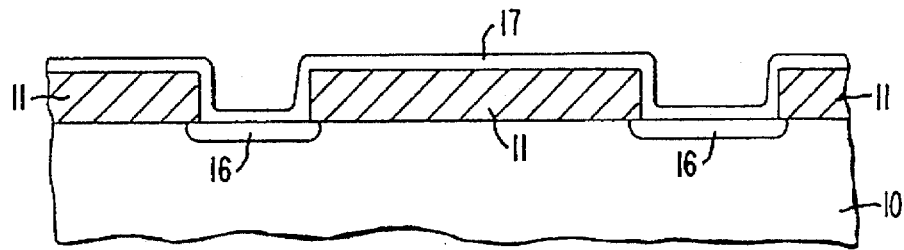
FIG. IE.
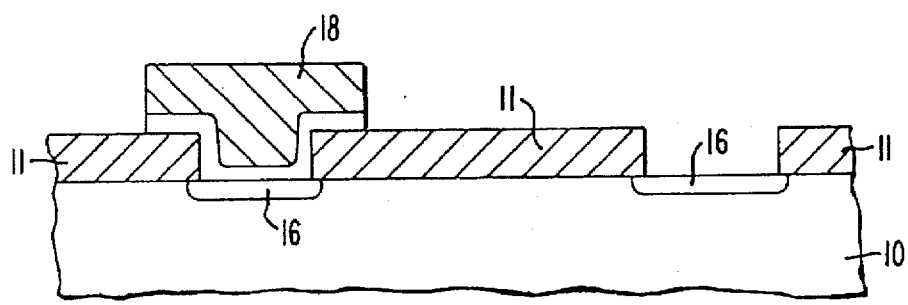
FIG. IF.
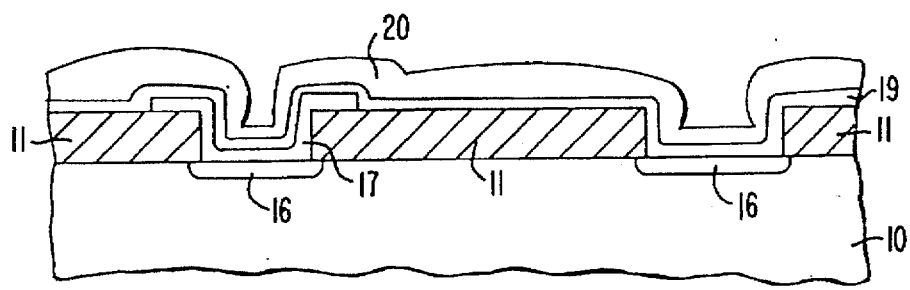
FIG. IG.
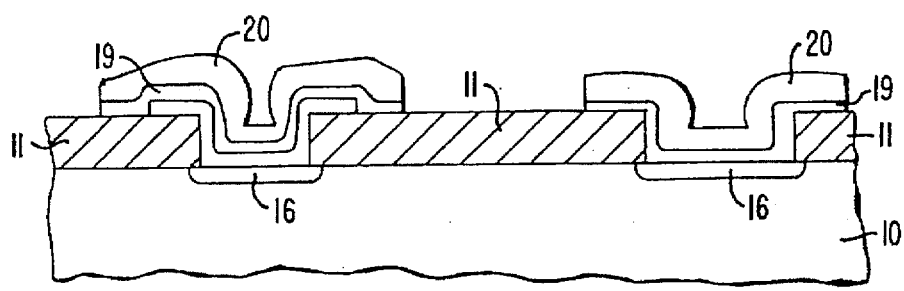
FIG. IH.

5,670,419

METHOD OF FABRICATING ANTIFUSES IN AN INTEGRATED CIRCUIT DEVICE AND RESULTING STRUCTURE

This application is a Rule 60 continuation application of Ser. No. 08/158,134, filed Nov. 24, 1993, now U.S. Pat. No. 5,527,745; which is a Rule 60 Divisional of Ser. No. 07/782,837, filed Oct. 24, 1991, now U.S. Pat. No. 5,322,812; which is a continuation-in-part of Ser. No. 07/672,501, filed Mar. 20, 1991, now abandoned.

BACKGROUND OF THE INVENTION

The present invention relates generally to the fabrication of integrated circuit devices and, more particularly, to the fabrication of antifuses in integrated circuits.

Antifuses are elements which are located between two conducting lines in an integrated circuit. The antifuse has a very high resistance (to form essentially an open circuit) in an unprogrammed ("off") state to keep the two conducting lines electrically separated. In a programmed ("on") state, the antifuse has a low resistance (to form essentially a closed circuit) to electrically connect the two conducting lines.

Ideally antifuses should have a low parasitic capacitance in the unprogrammed state and should occupy minimal layout area, with very short programming times, and should require programming voltages which are not so high as to require additional process complexity to accommodate the high programming voltages. In the programmed state the antifuse should, of course, have as low a resistance as possible.

One antifuse which has many of these advantages is disclosed in U.S. Pat. Nos. 4,442,507 and 4,796,074, issued to B. Roesner on Apr. 10, 1984 and Jun. 3, 1989 respectively. This antifuse is formed between a silicon layer, either a doped region in the semiconductor substrate of an integrated circuit or a doped polysilicon layer, and a metal conducting layer above.

The present invention substantially improves many of the processing steps or solves many of the deficiencies in the steps used in fabricating the disclosed present antifuse.

SUMMARY OF THE INVENTION

The present invention provides for many improvements to a generalized method of fabricating antifuses between a silicon layer and a metal layer in an integrated circuit. In the deposition of an amorphous silicon layer, for example, the present invention provides for the deposition to be performed in a low-pressure, essentially nitrogen-free atmosphere.

These improvements also include the replacement of platinum, which is very expensive, used to form a barrier layer in the generalized method and the resulting antifuse and contact structures.

BRIEF DESCRIPTION OF THE DRAWINGS

FIGS. 1A–1H are cross-sectional diagrams illustrative of the general steps used in manufacturing the prior art antifuse noted above.

DETAILED DESCRIPTION OF SPECIFIC EMBODIMENTS

FIGS. 1A–1H illustrate the general steps used in fabricating the antifuse disclosed in the patents above. While of some of the steps are not necessarily described in the patents noted above, the steps described are gleaned from a reading of the patents and reflect standard, present day engineering practices to those skilled in the semiconductor processing field.

The fabrication steps discussed herein are directed to only part of a complete process for manufacturing an integrated circuit. The antifuses are formed in the contact holes, the openings in the silicon dioxide layer to the underlying silicon layer, which may be doped regions in the semiconductor substrate itself, or doped regions of an epitaxial silicon layer on the substrate, or a doped polysilicon layer over the substrate. Thus many of the steps which are used in the manufacture of integrated circuits, such as the formation of doped regions in the semiconductor substrate near the beginning of a process, or the final metal layer and glass passivation layer depositions near the end of a process, for example, are not discussed.

Figure 1A:
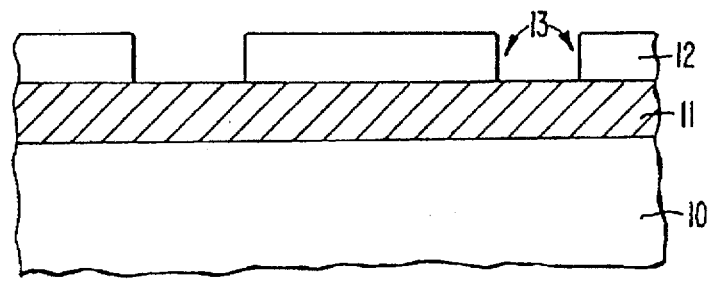

In FIG. 1A the silicon layer 10 is covered by an insulating layer 11 of silicon dioxide through which contact holes are to be formed. The layer 11 is relatively thick in the range of 5000 to 15000 Angstroms. The silicon dioxide layer 11 is formed from a deposited oxide, such as borophosphosilicate glass (BPSG).

Figure 1B:
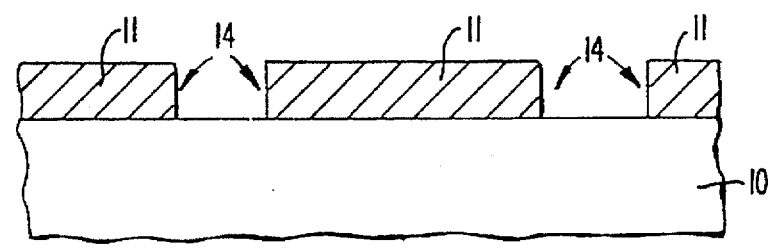

To form contact holes in the dioxide layer 11, a photoresist layer 12 is deposited over the layer 11. By standard photolithographic process, apertures 13 are formed in the photoresist layer 12. The apertures 13 in the photoresist layer 12 act as a mask in an etching step of the underlying silicon dioxide layer 11. The apertures 14 formed by the etching step in the layer 11 are the contact holes through which, in a typical semiconductor process, a deposited conducting layer makes contact to the silicon layer 10. The photoresist layer 12 is then removed. This point in the process is shown in FIG. 1B.

In one or more of the contact holes 14 antifuses are to be formed. A layer 15 of platinum, a noble metal, is deposited over the dioxide layer 11 and into the contact holes 14. Before the platinum is deposited, however, two steps are performed. First, the surface of the silicon layer 10 in the holes 14 is cleaned by a HF dip to remove native oxide. Then some of the silicon layer is etched by a deslag process to clean the silicon surface. These steps ensure the integrity of the interface between the silicon of the layer 10 and the platinum layer 15.

Figure 1C:
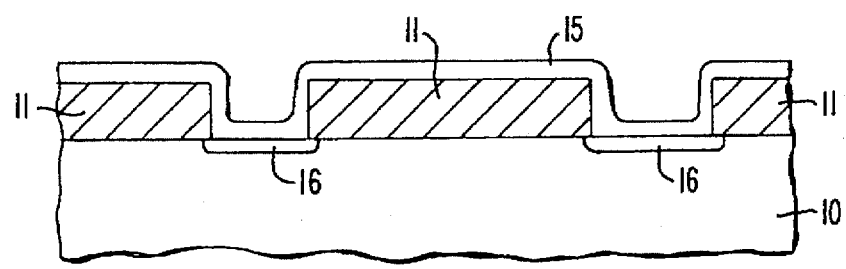

The platinum layer 15 is deposited by sputtering. Then the processing temperature is elevated to 450° to 700° C. so that the platinum reacts with the underlying silicon 10 to form platinum silicide layers 16 in the holes 14 at the platinum-silicon interface as illustrated in FIG. 1C.

Figure 1D:
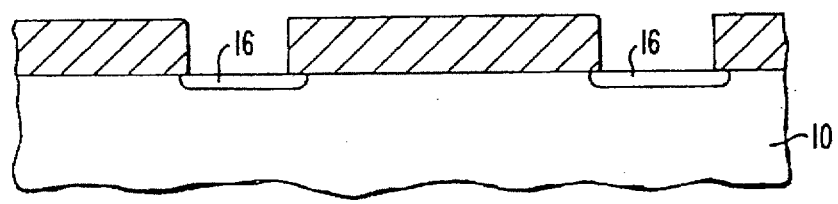

Aqua regia is then used to remove the unreacted portions of the platinum layer 15. As is known to those in the semiconductor process field, aqua regia selectively etches platinum, but not the platinum silicide compound. At this point the holes 14 have a platinum silicide layer 16 at their bottoms as shown in FIG. 1D. Then a HF dip is performed to remove the surface oxide grown on the platinum silicide during the reaction cycle. Then a layer 17 of amorphous silicon is deposited. The result is shown in FIG. 1E.

To define the locations where antifuses are to be placed, rather than standard contacts, a antifuse mask layer 18 of photoresist is deposited. By photolithographic techniques, portions of the layer 18 are left over contact holes 14 where antifuses are to be formed. A silicon etch step is performed and the thin amorphous silicon layer 17 in the unmasked contact holes 14 and on most of silicon dioxide layer 11 is removed. Thus, an antifuse contact is formed as shown in FIG. 1F. The photoresist layer 18 is then removed before subsequent processing.

Before metal is deposited, a sputter etching step is performed to clean the surface of the remaining portion of the amorphous silicon layer 17.

Then two metal layer deposition steps follow as shown in FIG. 1G. First, a layer 19 of titanium-tungsten (TiW) alloy is deposited. Over the layer 19, a layer 20 of aluminum alloy is then deposited. The TiW layer 19 acts as a barrier layer to prevent the aluminum layer 20 from reacting with the amorphous silicon layer 17. This dual metal layer structure forms the metal layer for the conducting line which is defined after photolithographic and etching steps as shown in FIG. 1H.

The dual metal layers on the right of the figure are representative of a metal conducting line in contact with a second conducting line below, the silicon layer 10. On the left, the dual metal conducting line is located above the second conducting line below with an antifuse between. Left unprogrammed, the amorphous silicon layer 17 electrically isolates the two conducting lines. When subjected to a large voltage difference between the two conducting lines, the layer 17 programs and the two lines are connected. The antifuse is programmed.

The present invention offers many improvements to the general process steps described above. In the step of etching the contact holes 14 described with respect to FIGS. 1A and 1B, it has been found that the sidewalls of the contact holes 14 must be as vertical as possible. The verticality of the sidewalls ensures that in the following sputter etching step performed before the platinum layer 15 is deposited, silicon dioxide of the layer 11 are not resputtered from the sidewalls to contaminate the surface of the silicon layer 10. To obtain vertical sidewalls, the contact holes 14 are reactive ion-etched in a low pressure atmosphere, which also helps clean the surface of the silicon layer 10.

In the sputter etching step which is also used to clean the surface of the silicon layer 10 just prior to the deposition of platinum, typically less than 100 Angstroms of silicon dioxide is removed. This small removal of silicon dioxide optimizes the later formation of the platinum silicide and lowers contact resistance.

For the reaction of the platinum with silicon, normally pure nitrogen gas is used as a reaction atmosphere. However, it has been found that a gas mixture of nitrogen and hydrogen for the reaction atmosphere is more effective because the reducing atmosphere during the reaction results in less oxygen incorporation in the silicide. An additional improvement is that at the end of the platinum reaction step, the heated wafers are exposed to an oxygen atmosphere to grow native oxide on the top surface of silicide thereby protecting the platinum silicide from aqua regia in the following step to remove the unreacted platinum.

An enhancement to the platinum removal step itself is to add 50% water to the aqua regia. This addition increases the selectivity of the aqua regia for the unreacted platinum in contrast to the platinum silicide.

In the cleaning step before the deposition of the amorphous silicon layer 17, dilute hydrogen fluoride (HF) is used to remove any unwanted oxide on the surface of the platinum silicide layer 16. This cleaning process improves the electrical characteristics of the antifuses and gives a much tighter statistical distribution of the programming voltages of the antifuses.

In the chemical vapor deposition step of the amorphous silicon layer 17, a very low pressure process has been found to be desirable. Prior to the actual deposition of the silicon, the deposition chamber is evacuated to a base pressure of less than 20 millitorr several times. Each evacuation is followed by a purge of nitrogen or argon gas. These evacuations and purges ensure the removal of any residual oxygen in the deposition chamber thus eliminating the formation of any oxide interface on the surface of the platinum silicide layers 16 during initial deposition of amorphous silicon.

The deposition of the amorphous silicon is performed in a process chamber with very slow leak rate of 2 or less millitorr per minute. This prevents unwanted gases from leaking back during the deposition and changing the properties of amorphous silicon layer. This very slow leak rate is important since the deposition is carried out in the chamber at less than the atmospheric pressure. Temperature is kept low, approximately 540° C., to prevent the spurious nucleation of amorphous silicon which adversely affects the programming voltage of the antifuse and, ultimately, the semiconductor production yield of the integrated circuits. An additional improvement is to eliminate nitrogen during the amorphous silicon deposition, which was heretofore used in previous amorphous silicon deposition processes, from the process chamber. It has been found that the gas encourages the formation of silicon nitride in the deposited amorphous silicon layer 17 and silicon nitride has been found to degrade the electrical performance of the completed antifuse.

Besides the low-pressure chemical vapor deposition (LPCVD) process described above, plasma-enhanced chemical vapor deposition (PECVD) may be used to deposit the amorphous silicon layer 17. With PECVD, much better control may be achieved over the deposition process of the amorphous silicon. Very good results have been obtained by introducing a mixture of argon and 5–10% silane into the process chamber. Flow rates of 4000 sccm (standard cubic centimeters per minute) for argon and 200–400 sccm for silane are used. The process is run with temperatures in the range of 300°–400° C. and pressures from 2–6 Torr. Optimum power ranges have been found to depend upon the particular reactor. With a Concept 1 reactor from Novellus Systems of San Jose, Calif., power from 400–800 Watts are optimum.

Another enhancement can be made to the etching step which removes the amorphous silicon layer 17 from those contact holes 14 which are not to contain antifuses. The etch step is done in a fluorine-based chemistry, such as $SF_6$, $NF_3$ or $CF_4$, which by its selectivity towards silicon, preserves the integrity of the platinum silicide layers 16.

Furthermore, the sputter etching step which is performed just before the deposition of the TiW layer 19 should be kept at a minimum. In cleaning the surface of the remaining portions of the amorphous silicon layer 17 of any residue, this etch removes some amorphous silicon material. The etch undesirably increases the statistical distribution of the electrical parameters of the completed antifuse. Thus it is desirable that the equivalent of less than 50 Angstroms of silicon dioxide be removed in this step.

The present invention also provides an alternative to the use of platinum in the described process. Platinum is an expensive material. In material costs alone, platinum adds approximately $45 for each 6-inch wafer for the process above. It is desirable that use of the material be avoided if possible.

The present invention offers some alternatives to the creation of the platinum silicide layers 16, which, it should be noted, serve several useful functions. Each region 16 provides a lower contact resistance for the TiW layer 19 to the underlying conducting silicon layer 10 whether as a standard contact or a programmed antifuse. In the contact holes 14 where a standard contact is to be made, the region 16 also acts as an etch stop. Without the region 16, the surface of the silicon layer 10 is gouged without special attention during any etching step. Gouging of the silicon layer 10 adversely affects the contact resistance between the TiW layer 19 and the silicon layer 10. Furthermore, in the contact holes 14 where antifuses are to be formed, region 16 acts as a barrier against the diffusion of any dopants from the silicon layer 10 to the amorphous silicon layer 17. Such doping of the amorphous silicon layer 17 has been found to degrade the electrical performance of the antifuse.

Figure 2A:
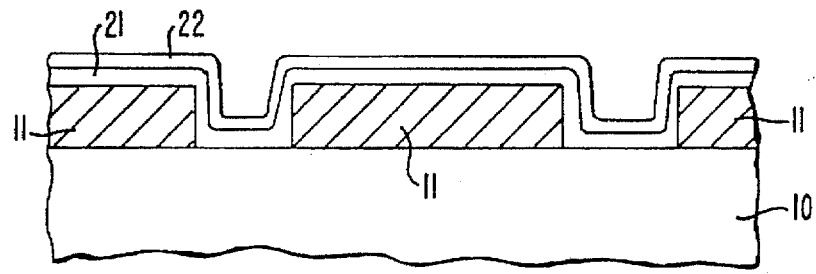
FIGS. 2A–2E illustrate a set of process steps which eliminates platinum from the process illustrated in FIGS. 1A–1H.

FIGS. 2A-2E illustrate alternative process steps which may be used to create antifuses (and standard contacts) without platinum. Starting from the creation of the contact holes 14 as illustrated in FIG. 1B, a contact metal layer 21 of titanium is deposited over the wafers. A barrier metal layer 22 of titanium nitride compound is then deposited. The result is shown in FIG. 2A. Alternatively, a contact metal layer 21 of Ti with a barrier metal layer 22 of TiW may be used, or, a single layer of TiW may be used for both layers 21 and 22.

A rapid thermal anneal step may then be used. The wafers are heated to a temperature of 500°-800° C. for 10-60 seconds by flash lamps. This step helps reduce the contact resistance and improves the barrier properties of the layers 21 and 22 against the dopant diffusion from the silicon layer 10 to the amorphous silicon layer described below.

Figure 2B:
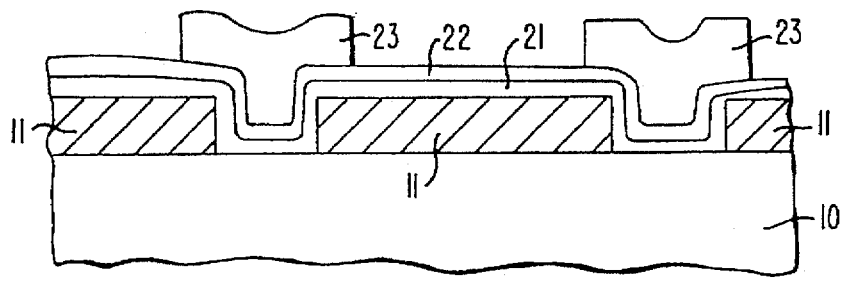

The Ti and TiN layers 21 and 22 are masked with a barrier layer photoresist mask 23 to define an area which is slightly larger than the contact hole 14 as shown in FIG. 2B. This oversizing ensures that the layers 21 and 22 cover all contact holes 14 completely.

Figure 2C:
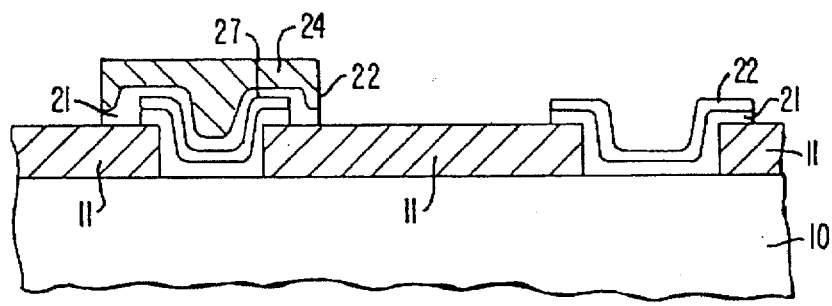

Then, as described previously, a thin layer 27 of amorphous silicon is deposited, followed by a layer of photoresist 24. The layer 24 is defined by standard photolithographic processes and etching by an antifuse mask which defines the amorphous silicon layer 27 to be slightly oversized so as to overlap around the layers 21 and 22. As shown in FIG. 2C, the defined photoresist layer 24 acts as a mask over a contact hole in which an antifuse is to be fabricated. The amorphous silicon layer 27 is etched away by an etchant of $SF_6$, $NF_3$ or $CF_4$. The layer 27 remains only in the contact holes 14 where antifuses are to be located.

Figure 2D:
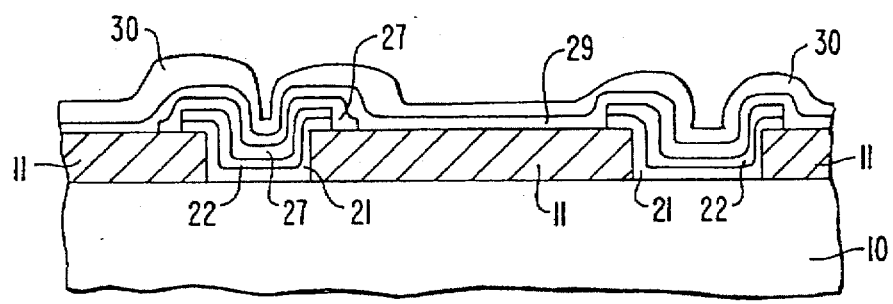
Figure 2E:
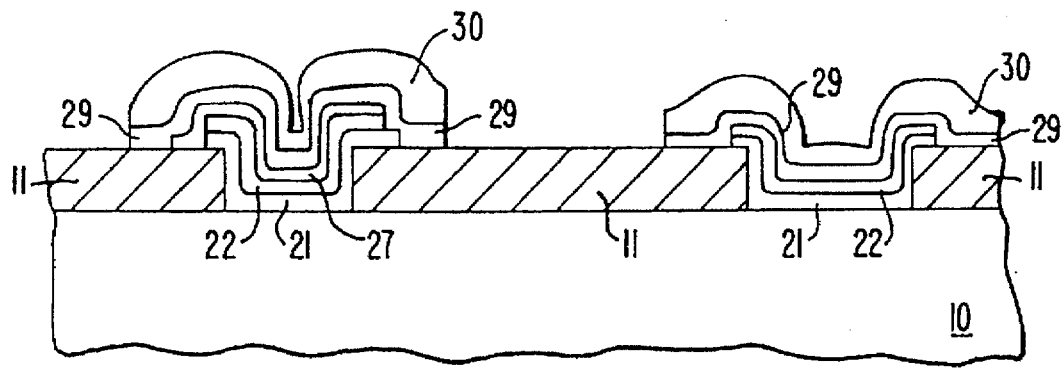

Then the steps follow the process described previously. A layer 29 of TiW is deposited, followed by a layer 30 of aluminum alloy, as shown in FIG. 2D. Then the dual-layer conducting line is defined. The resulting antifuse and contact structures are shown in FIG. 2E.

Figure 3F:
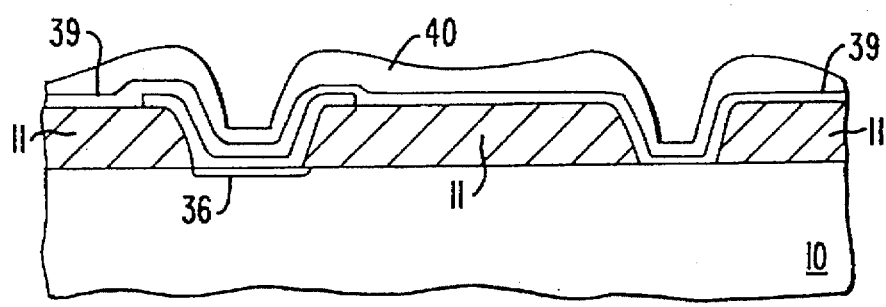
FIGS. 3A–3G illustrate another set of process steps which eliminates platinum from the process illustrated in FIGS. 1A–1H.
Figure 3G:
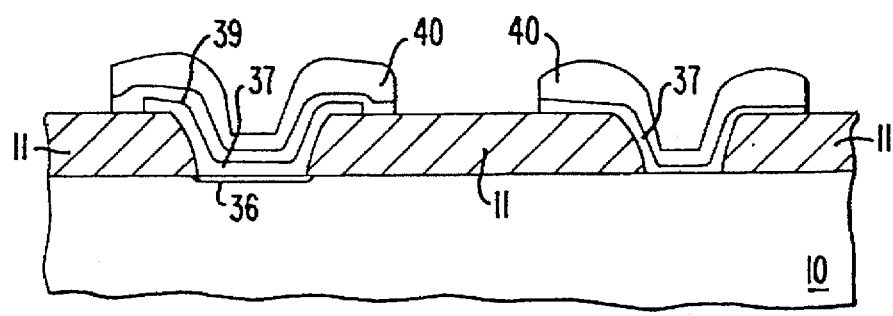
Figure 3A:
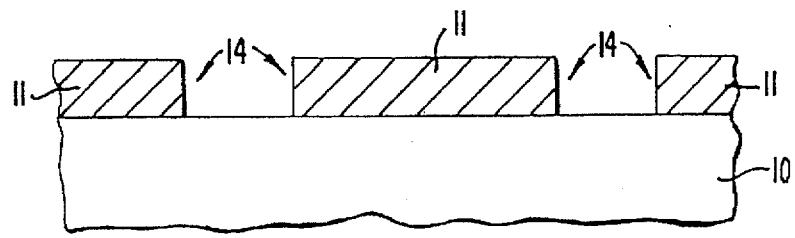
Figure 3B:
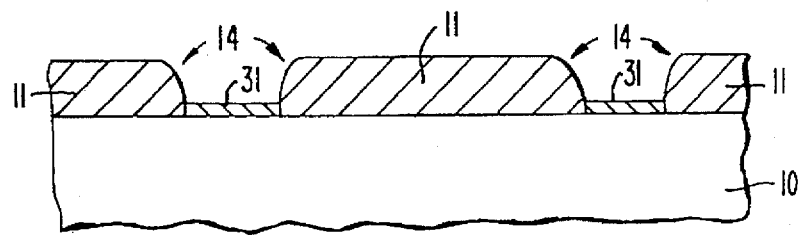

Another embodiment of the present invention to replace platinum is illustrated in FIGS. 3A-3F. As shown in FIG. 3A, the process starts with the formation of the contact holes 14 in the insulating layer 11. Some of the holes 14 are used for standard contacts and others are used for the antifuses. As in the previous drawings, the contact hole of the right represents the standard contact and the one on the left represents the those used for the antifuses.

Next, with the insulating layer 11 being borophosphosilicate glass (BPSG), which is a form of silicon dioxide, an oxidizing step is used to reflow the insulating layer 11. This step, illustrated in FIG. 3B, rounds the sharp edges of the layer 11 and grows an oxide layer 31 over the exposed silicon in the contact holes. Typically the oxide layer 31 is grown to a thickness of a few hundred Angstroms, with 200 Angstroms being optimal. Of course, if the insulating layer 11 is formed from other deposited oxide, such as phosphosilicate glass, this step is used to grow the oxide layers 31 without edge rounding.

Figure 3C:
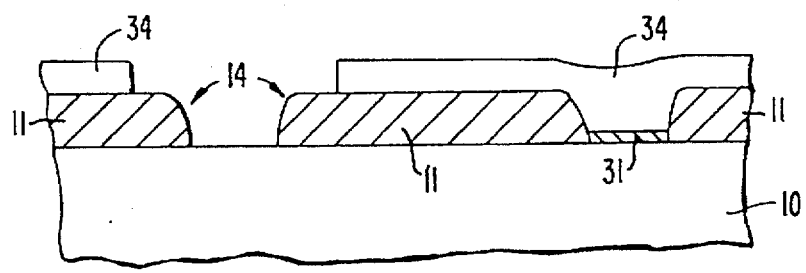

A photoresist layer 34 is then deposited over the substrate 10 and the insulating layer 11. By standard photolithography and etching methods, the layer 11 is defined so that the contact holes for the antifuses are exposed and the contact holes for the standard contacts are covered. By a HF dip etching step, the thin oxide layer 31 is removed from the contact holes for the antifuse to expose the silicon. This is shown in FIG. 3C.

Figure 3D:
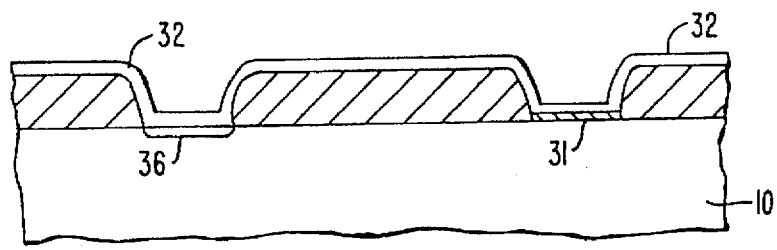

The photoresist layer 34 is then stripped and a layer 32 of titanium from 300-1000 Angstroms thick is sputtered over the substrate 10 and the oxide layer 11, as illustrated in FIG. 3D. Other refractory metals, such as tantalum, tungsten, molybdenum and cobalt, may be substituted for titanium.

The wafer is then heated to a temperature of approximately 600-750 degrees Centigrade for 10-60 seconds in a rapid thermal anneal system for a reaction at the titanium-silicon interface. Alternatively this heating can be carried in a furnace tube. A titanium silicide layer 36 is formed in the contact hole where an antifuse is to be formed.

The unreacted titanium from the layer 32 is then stripped off with either a mixture of ammonium hydroxide and hydrogen peroxide ($NH_4OH+H_2O_2$) or sulfuric acid and hydrogen peroxide ($H_2SO_4+H_2O_2$). After the unreacted titanium is removed, the wafer is heated once again to a temperature of approximately 750-900 degrees Centigrade to ensure that all of the titanium in the layer 36 has completely reacted with the silicon to form $TiSi_2$.

Figure 3E:
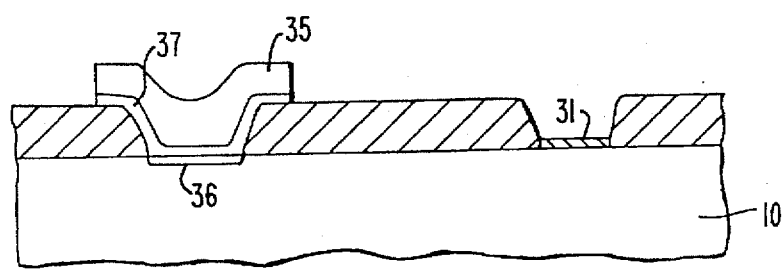

Then, as described previously, a thin layer 37 of amorphous silicon, approximately 800 Angstroms thick, is deposited. After a photoresist layer 35 is deposited, an antifuse mask having an overlap with the contact hole mask defines portions of the silicon layer 37 to completely cover the antifuse contact holes. By an etching step, the amorphous silicon layer 37 is removed over the standard contact holes. The oxide layer 31 in these holes acts as an etch stop and prevents etching into the silicon layer 10. The portion of the amorphous silicon layer 37 covering the antifuse contact holes is left. The result is shown in FIG. 3E.

With a HF dip, the oxide layer 31 is removed. Then the photoresist layer 35 is stripped off. As described previously, a layer 39 of TiW is sputtered on, followed by a layer 40 of aluminum alloy which is also sputtered on. The results are illustrated in FIG. 3F.

Finally, the dual metal layers 39 and 40 are defined into a conducting line by photolithography and etching. The completed antifuse and standard contact structures are shown in FIG. 3G.

FIGS. 4A-4G illustrate the manufacturing steps of a another embodiment of the present invention. In this embodiment, an antifuse structure is formed between a polysilicon layer covered by a metal silicide layer (which is often termed a polycide structure or layer) and a conducting metal layer above. At the same time, this embodiment allows standard contacts to be made between the polycide layer and the metal layer, and between the metal layer and the underlying substrate.

Figure 4A:
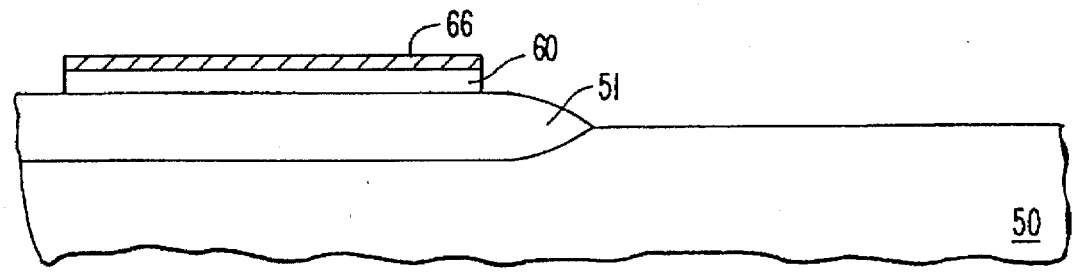
FIGS. 4A–4G show still another set of process steps which eliminates platinum from the process.

As shown in FIG. 4A, a thick field oxide layer 51 is formed on a portions of a semiconductor substrate 50. On the insulating layer 51, a polysilicon layer 60 is deposited and followed by a metal silicide layer 66 formed by tungsten silicide. The layer 66 is created by chemical vapor or sputter deposition techniques. The layer 66 could also be formed by depositing a metal and reacting it with the underlying polysilicon layer 60 at high temperatures. Besides tungsten, typical examples of metals to form the metal silicide layer 66 include cobalt, titanium, molybdenum and tantalum.

Figure 4B:
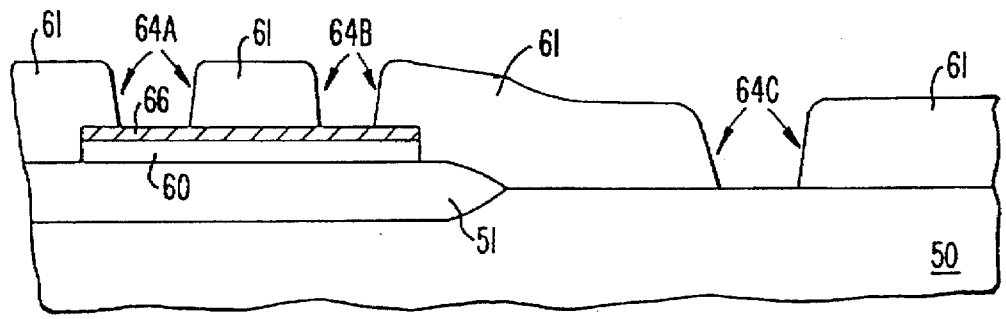
Figure 4C:
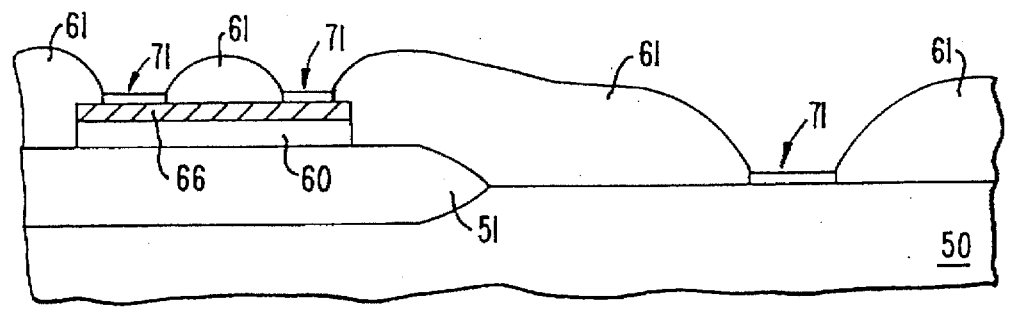

Then, a second insulating layer 61 of borophosphosilicate glass (BPSG) is deposited over the substrate 50 and the layer 51. The BPSG layer 61, which is relatively thick, from 5000 to 15000 Å, is then subjected to a densification step by heating. Then by masking and etching, holes are formed in the layer 61. As shown in FIG. 4B, three representative holes 64A, 64B and 64C are formed. An antifuse structure is to be formed in the hole 64A, a standard contact in the hole 64B between the polycide layer and a metal layer yet to be formed, and a standard contact in the hole 64C between the metal layer and the substrate 50.

Figure 4D:
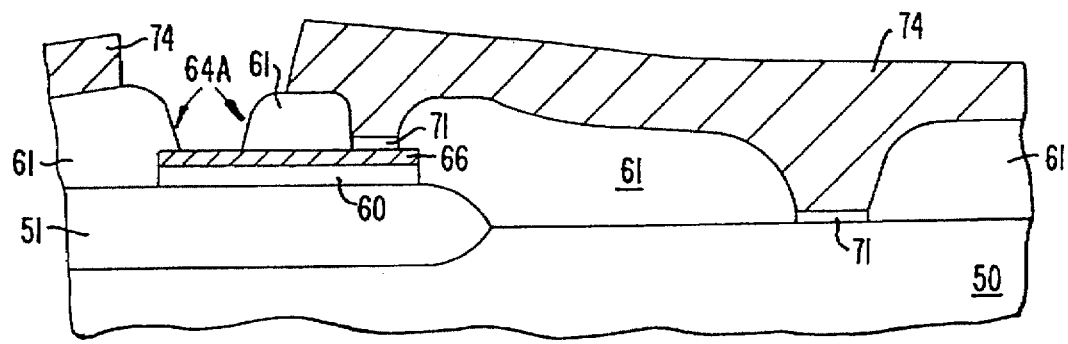

By a contact reflow and oxidation step, the edges of the BPSG layer 61 at the holes are rounded and, at the same time, a thin oxide layer 71 is formed in the holes 64A, 64B and 64C. Typically, this layer 71 has a thickness of a few hundred Å with 200 Å considered optimum. As shown in FIG. 4D, the substrate 50 is then covered by a thick layer of photoresist 74 and by a reverse antifuse mask the hole 64A is exposed. By a HF dip step, the layer 71 in the hole 64A is removed. This is shown in FIG. 4D.

Figure 4E:
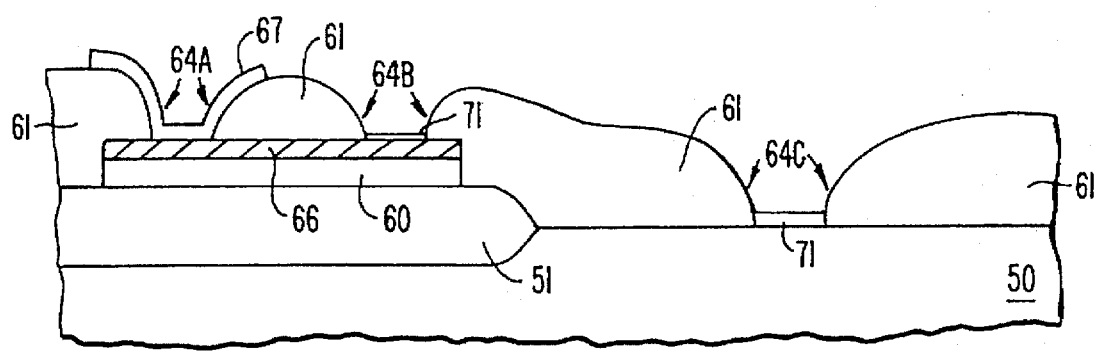

The photoresist layer 74 is then removed and a layer 67 of amorphous silicon is then deposited over the second insulating layer 61 and into the holes 64A, 64B and 64C. With the antifuse mask, the layer 67 is defined to cover only the hole 64A in contact with the tungsten silicide layer 66, as shown in FIG. 4E. In the etching step to define the amorphous silicon layer 67, the thin oxide layer 71 in the holes 64B and 64C respectively protect the tungsten silicide layer 66 in the hole 64B and the substrate 50 in the hole 64C. If the protecting oxide layer 71 were not available, the etching step for the amorphous silicon layer 67, which forms the antifuse material, would undesirably damage the substrate 50 since both the layer 67 and substrate 50 are silicon.

Figure 4F:
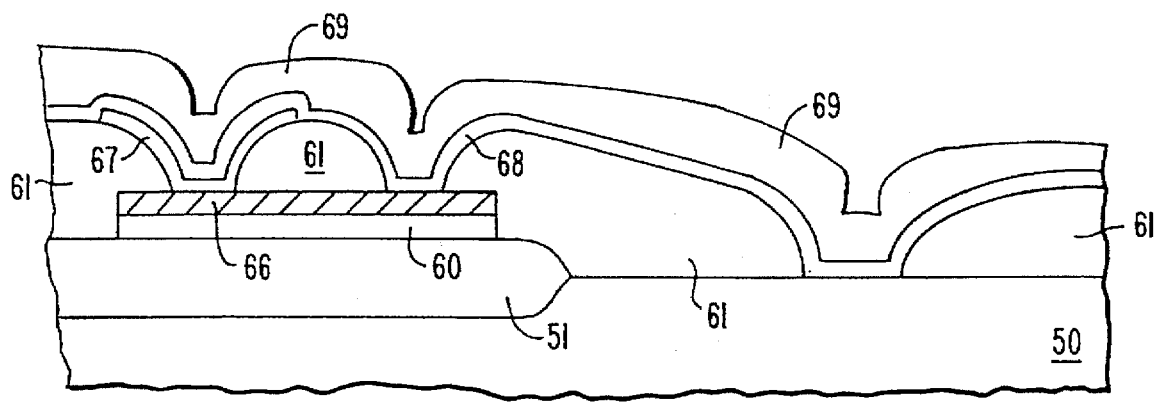

The oxide layers 71 in the holes 64B and 64C are then removed by a quick silicon dioxide etching step by dipping the wafer in a HF solution. This is followed by a blanket deposition of a barrier metal layer 68 formed by titanium-tungsten, titanium nitride, or combined layers of titanium and titanium nitride. A deposition of aluminum alloy to form a layer 69 follows. This is shown in FIG. 4F.

Figure 4G:
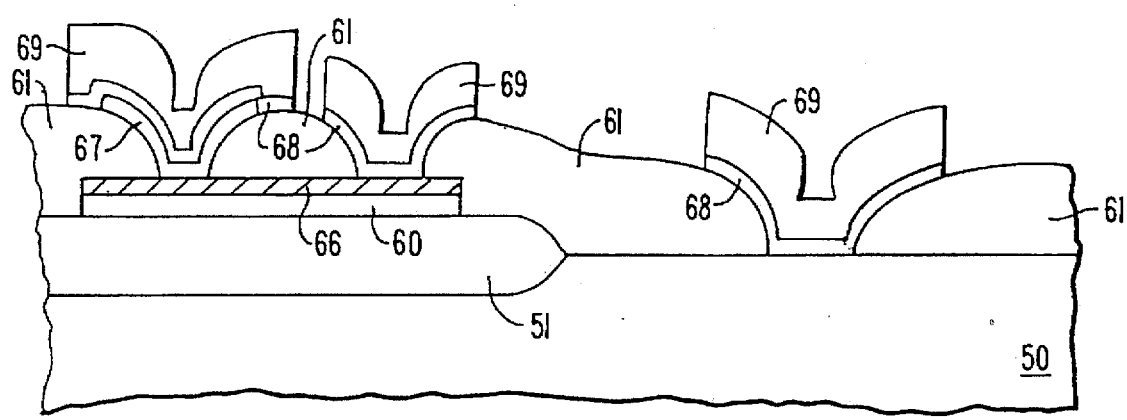

Finally, the barrier metal layer 68 and the aluminum alloy layer 69 are etched away to define the metal conducting line formed by the remaining portions of the layers 68 and 69. This structure is shown in FIG. 4G.

As described above, the amorphous silicon layer 67 lies between the first conducting line formed by the polysilicon layer 60 and tungsten silicide layer 66, and the metal conducting line, formed by the barrier metal layer 68 and the aluminum alloy layer 69. This is the antifuse structure. In what was formerly hole 64B is a standard contact between the metal conducting line and the polycide line. Similarly, in what was hole 64C is a standard contact between metal conducting line formed by the layers 68 and 69 to the substrate 50.

While the above is a complete description of the preferred embodiments of the invention, various alternatives, modifications and equivalents may be used. It should be evident that the present invention is equally applicable by making appropriate modifications to the embodiments described above. Therefore, the above description should not be taken as limiting the scope of the invention which is defined by the appended claims.

What is claimed is:

1. In a method of fabricating antifuses in an integrated circuit including the step of depositing a layer of amorphous silicon, an improvement comprising depositing said amorphous silicon layer in a process chamber having a low-pressure atmosphere with essentially no nitrogen, said atmosphere lower than ambient;

removing said atmosphere from said chamber at a rate of no more than 2 millitorr per minute;

whereby the avoidance of silicon nitride deposition in said amorphous silicon layer is enhanced.

2. The improvement of claim 1 further comprising pumping down said chamber to a base pressure and purging said chamber with a gas repeatedly prior to said amorphous silicon depositing step.

3. The improvement of claim 2 wherein said base pressure is no more than 20 millitorr and said gas is from the group of nitrogen and argon.

4. In a method of fabricating antifuses in an integrated circuit including the step of depositing a layer of amorphous silicon, an improvement comprising depositing said amorphous silicon in a process chamber by plasma-enhanced chemical vapor deposition at a temperature in the range of 300°–400° C.; and running a mixture of argon and 5–10% silane through said process chamber at a flow rate of 4000 sccm for argon and at a flow rate of 200–400 sccm for silane.

5. The method of claim 4 wherein said process chamber of said depositing step has a low-pressure atmosphere with essentially no nitrogen, said atmosphere lower than ambient; and further including the step of removing said atmosphere from said chamber at a rate of no more than 2 millitorr per minute;

whereby the avoidance of silicon nitride deposition in said amorphous silicon layer is enhanced.

6. In a method of fabricating antifuses in an integrated circuit including the step of depositing a layer of amorphous silicon, an improvement comprising depositing said amorphous silicon in a process chamber by plasma-enhanced chemical vapor deposition at a temperature in the range of 300°–400° C. and at a pressure in the range of 2–6 Torr.

7. The method of claim 6 wherein said process chamber has an atmosphere with essentially no nitrogen, and further including the step of removing said atmosphere from said chamber at a rate of no more than 2 millitorr per minute;

whereby the avoidance of silicon nitride deposition in said amorphous silicon layer is enhanced.

\* \* \* \* \*